(12) United States Patent
Kuwabara et al.

(10) Patent No.: US 10,573,090 B2
(45) Date of Patent: Feb. 25, 2020

(54) NON-TRANSITORY COMPUTER-READABLE STORAGE MEDIUM, DISPLAY CONTROL METHOD, AND DISPLAY CONTROL APPARATUS

(71) Applicant: FUJITSU LIMITED, Kawasaki-shi, Kanagawa (JP)

(72) Inventors: Hiroshi Kuwabara, Suginami (JP); Susumu Koga, Kawasaki (JP); Tomohiro Aoyagi, Toshima (JP); Yojiro Numata, Kita (JP); Toshiyuki Yoshitake, Kawasaki (JP); Nobuyasu Yamaguchi, Kawasaki (JP); Taichi Murase, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/888,804

(22) Filed: Feb. 5, 2018

(65) Prior Publication Data

US 2018/0225883 A1 Aug. 9, 2018

(30) Foreign Application Priority Data

Feb. 7, 2017 (JP) .................................. 2017-020691

(51) Int. Cl.
*G06T 15/00* (2011.01)
*G06T 19/20* (2011.01)
(Continued)

(52) U.S. Cl.
CPC ............ *G06T 19/20* (2013.01); *G06K 9/4604* (2013.01); *G06K 9/6211* (2013.01); *G06T 15/04* (2013.01); *G06F 17/50* (2013.01)

(58) Field of Classification Search
CPC ........ G06T 19/20; G06K 9/4604; G06F 17/50
(Continued)

(56) References Cited

U.S. PATENT DOCUMENTS

| 6,792,398 B1 * | 9/2004 | Handley ................. G06F 3/016 345/419 |
| 7,068,274 B2 * | 6/2006 | Welch ..................... G06T 13/20 345/426 |

(Continued)

FOREIGN PATENT DOCUMENTS

JP 2005-227876 8/2005

OTHER PUBLICATIONS

Hinckley, Ken, Francois Guimbretiere, Maneesh Agrawala, Georg Apitz, and Nicholas Chen. "Phrasing techniques for multi-stroke selection gestures." In Proceedings of Graphics Interface 2006, pp. 147-154. Canadian Information Processing Society, 2006.*

(Continued)

*Primary Examiner* — Phu K Nguyen
(74) *Attorney, Agent, or Firm* — Fujitsu Patent Center

(57) ABSTRACT

A non-transitory computer-readable storage medium storing a program that causes a computer to execute a process including displaying a plurality of first edge lines extracted from a captured image including a structure captured by a camera and a plurality of second edge lines included in a three dimensional model corresponding to structure data of the structure, detecting a first operation that designates target first edge lines included in the plurality of first edge lines in a first order, detecting a second operation that designates target second edge lines included in the plurality of second edge lines in a second order, associating each of the target second edge lines with one of the target first edge lines based on the first order and the second order, and superimposing the three dimensional model with the structure in the captured image based on a result of the associating.

7 Claims, 13 Drawing Sheets

(51) Int. Cl.
*G06K 9/46* (2006.01)
*G06T 15/04* (2011.01)
*G06K 9/62* (2006.01)
*G06F 17/50* (2006.01)

(58) Field of Classification Search
USPC .......................................................... 345/418
See application file for complete search history.

(56) References Cited

U.S. PATENT DOCUMENTS

| | | | | |
|---|---|---|---|---|
| 8,595,218 | B2* | 11/2013 | Bell | G06F 3/0425 |
| | | | | 707/722 |
| 8,854,362 | B1* | 10/2014 | Poursohi | G06T 17/00 |
| | | | | 345/420 |
| 9,058,058 | B2* | 6/2015 | Bell | G06F 3/011 |
| 9,128,519 | B1* | 9/2015 | Coates | G06F 3/011 |
| 9,811,166 | B2* | 11/2017 | Bell | G06F 3/011 |
| 2005/0174361 | A1 | 8/2005 | Kobayashi et al. | |

OTHER PUBLICATIONS

McGuffin MJ, Jurisica I. Interaction techniques for selecting and manipulating subgraphs in network visualizations. IEEE Transactions on Visualization and Computer Graphics. Nov. 2009;15(6):937-44.*

Dehmeshki H, Stuerzlinger W. Design and evaluation of a perceptual-based object group selection technique. InProceedings of the 24th BCS Interaction Specialist Group Conference Sep. 6, 2010 (pp. 365-373). British Computer Society.*

* cited by examiner

| SELECTION ORDER | STRUCTURE | MODEL |
|---|---|---|
| 1 | SL11 | ML11 |
| 2 | SL12 | ML12 |
| 3 | SL13 | ML13 |
| ... | ... | ... |

NON-TRANSITORY COMPUTER-READABLE STORAGE MEDIUM, DISPLAY CONTROL METHOD, AND DISPLAY CONTROL APPARATUS

CROSS-REFERENCE TO RELATED APPLICATION

This application is based upon and claims the benefit of priority of the prior Japanese Patent Application No. 2017-20691, filed on Feb. 7, 2017, the entire contents of which are incorporated herein by reference.

FIELD

The embodiment discussed herein is related to a non-transitory computer-readable storage medium, display control method, and display control apparatus.

BACKGROUND

A three-dimensional computer aided design (CAD) is used in designs for structures such as various types of parts including, for example, a casing of a personal computer, a heat sink, an exterior part of a smart phone, and the like. It is desired in some cases to check whether or not the structure constructed based on data of the three-dimensional CAD is constructed following a model of the structure on the three-dimensional CAD. In this case, for example, the check is facilitated when a captured image obtained by shooting the constructed structure is overlapped with the model of the structure of the three-dimensional CAD. In addition, a configuration has been proposed in which a CAD shape model at a position instructed by a stylus is superimposed and displayed on a captured image obtained by shooting a mockup model to reflect characteristics such as a color, a texture, and a pattern on the mockup model.

For example, Japanese Laid-open Patent Publication No. 2005-227876 discusses a related art technology.

SUMMARY

According to an aspect of the invention, an apparatus includes

A non-transitory computer-readable storage medium storing a program that causes a computer to execute a process, the process including displaying, on a screen, a plurality of first edge lines extracted from a captured image including a structure captured by a camera and a plurality of second edge lines included in a three dimensional model corresponding to structure data of the structure, the plurality of first edge lines and the plurality of second edge lines being selectable by using a input device for the screen, detecting a first operation, by using the input device, that designates target first edge lines included in the plurality of first edge lines in a first order, detecting a second operation, by using the input device, that designates target second edge lines included in the plurality of second edge lines in a second order, associating each of the target second edge lines with one of the target first edge lines based on the first order and the second order, and superimposing, on the screen, the three dimensional model with the structure in the captured image based on a result of the associating.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 2 illustrates an example of a configuration of a selection order storage unit;

DESCRIPTION OF EMBODIMENT

However, to accurately overlap a structure on a captured image and a model of a structure of a three-dimensional CAD on each other, for example, a large number of edge lines of the structure on the captured image and ridge lines of the model (edge line of the model) are to be selected and associated with each other. For this reason, the number of times to perform an operation for selecting the large number of edge lines and ridge lines is increased, and an operation for associating the edge lines of the structure and the ridge lines of the model with each other is complicated.

According to an aspect, the present disclosure aims at facilitating an association between the edge lines extracted from the image and the ridge lines of the model.

Hereinafter, an exemplified embodiment of a display control program, a display control method, and a display control apparatus of the present disclosure will be described in detail with reference to the drawings. It is noted that the present exemplified embodiment is not intended to limit the disclosed technology. In addition, the following configurations of the exemplified embodiment may be appropriately combined with each other within a range without producing contradictions.

Exemplified Embodiment

Figure 1:
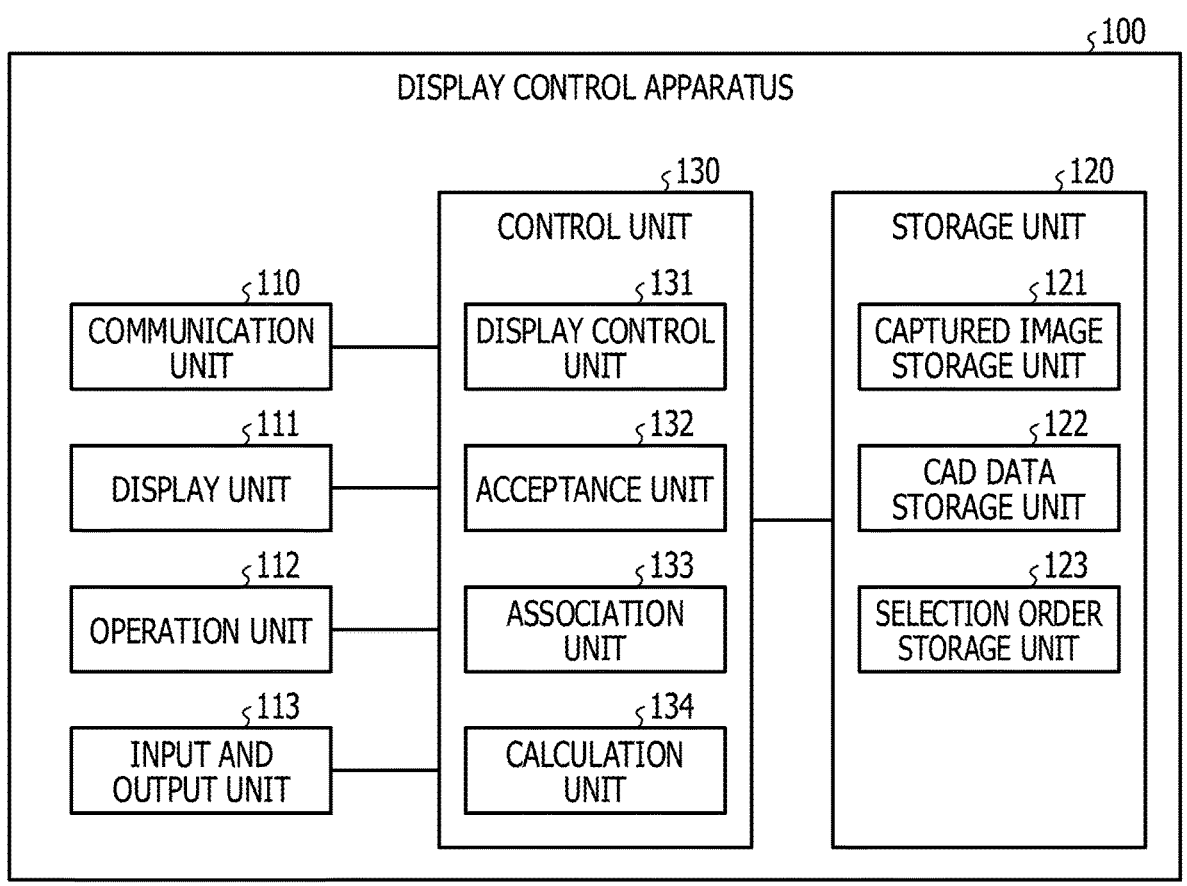
FIG. 1 is a block diagram illustrating an example of a configuration of a display control apparatus according to an exemplary embodiment.

FIG. 1 is a block diagram illustrating an example of a configuration of a display control apparatus according to an exemplary embodiment. A display control apparatus 100 illustrated in FIG. 1 is an example of a computer that executes an application for performing display control processing for overlapping the captured image obtained by shooting the structure and the model of the structure of the three-dimensional CAD with each other. A stationary or desktop personal computer can be adopted as an example of the display control apparatus 100. A portable personal computer, a tablet terminal, and the like can also be adopted as the display control apparatus 100 in addition to the above-mentioned stationary personal computer, for example.

The display control apparatus 100 displays a plurality of edge lines extracted from a captured image including a structure which is shot by an imaging apparatus and a plurality of ridge lines included in a model in accordance with the structure data of the structure (hereinafter, also referred to as CAD data) in a manner that those lines can be selected. The display control apparatus 100 accepts a selection of the predetermined number of edge lines among the plurality of displayed edge lines and a selection of the predetermined number of ridge lines among the plurality of displayed ridge lines. The display control apparatus 100 associates the predetermined number of respective edge lines with the predetermined number of respective ridge lines based on the respective selection orders of the predetermined number of selected edge lines and the respective selection orders of the predetermined number of selected ridge lines. The display control apparatus 100 superimposes and displays the model on the captured image in an orientation in which respective positions of the predetermined number of ridge lines correspond to positions of the edge lines associated with the ridge lines. With this configuration, the display control apparatus 100 can facilitate the association between the edge lines extracted from the image and the ridge lines of the model.

As illustrated in FIG. 1, the display control apparatus 100 includes a communication unit 110, a display unit 111, an operation unit 112, an input and output unit 113, a storage unit 120, and a control unit 130. It is noted that the display control apparatus 100 may also include function units such as various input devices and audio output devices other than the function units illustrated in FIG. 1, for example.

The communication unit 110 is realized, for example, by a network interface card (NIC) or the like. The communication unit 110 is a communication interface that is connected to another information processing apparatus in a wired or wireless manner via a network that is not illustrated in the drawings and governs a communication of information with the other information processing apparatus.

The display unit 111 is a display device configured to display various information. The display unit 111 is realized, for example, by a liquid crystal display or the like as a display device. The display unit 111 displays various screens such as a display screen input from the control unit 130.

The operation unit 112 is an input device configured to accept various operations from a user of the display control apparatus 100. The operation unit 112 is realized, for example, by a keyboard, a mouse, or the like as an input device. The operation unit 112 outputs an operation input by the user to the control unit 130 as operation information. It is noted that the operation unit 112 may also be realized by a touch panel or the like as the input device, and the display device of the display unit 111 and the input device of the operation unit 112 may be integrated with each other.

The input and output unit 113 is, for example, a memory card reader/writer (R/W). The input and output unit 113 reads out the captured image and the CAD data stored in a memory card to be output to the control unit 130. The input and output unit 113 also stores the superimposed image output from the control unit 130 in the memory card, for example. It is noted that an SD memory card or the like can be used as the memory card, for example.

The storage unit 120 is realized, for example, a semiconductor memory element such as a random access memory (RAM) or a flash memory or a storage device such as a hard disc or an optical disc. The storage unit 120 includes a captured image storage unit 121, a CAD data storage unit 122, and a selection order storage unit 123. The storage unit 120 also stores information used in the processing by the control unit 130.

The captured image storage unit 121 stores the input captured image. The captured image storage unit 121 stores, for example, a captured image obtained by shooting a structure constructed based on the CAD data of the three-dimensional CAD by the imaging apparatus.

The CAD data storage unit 122 stores the input CAD data. The CAD data storage unit 122 stores, for example, the CAD data corresponding to the structure data of the structure generated by the computer that executes the three-dimensional CAD. It is noted that the CAD data storage unit 122 may also store the information of the model of the structure generated based on the CAD data while being associated with the CAD data.

The selection order storage unit 123 stores selection orders of the edge lines of the structure and selection orders of the ridge lines of the model of the structure generated based on the CAD data of the structure which are selected by the user while being associated with each other. FIG. 2 illustrates an example of a configuration of a selection order storage unit. As illustrated in FIG. 2, the selection order storage unit 123 includes items such as "selection order", "structure", and "model". The selection order storage unit 123 stores elements as one record for each selection order, for example.

The "selection order" is information indicating the selection orders of the edge lines of the structure and the selection orders of the ridge lines of the model which are selected by the user. The "structure" is an identifier for identifying the selected edge line of the structure on the captured image. The "model" is an identifier for identifying the selected ridge line of the model. In the example of FIG. 2, it is indicated that the edge lines of the structure are selected in the stated order of "SL11", "SL12", and "SL13", and the ridge lines of the model are selected in the stated order of "ML11", "ML12", "ML13". In addition, in the example of FIG. 2, it is indicated that "SL11" and "ML11", "SL12" and "ML12", and "SL13" and "ML13" are respectively associated with each other.

Descriptions will be provided with reference to FIG. 1 again. The control unit 130 is realized, for example, while a program stored in an internal storage device is executed while the RAM is used as an operation area by a central processing unit (CPU), a micro processing unit (MPU), or the like. The control unit 130 is realized, for example, by an integrated circuit such as an application specific integrated circuit (ASIC) or a field programmable gate array (FPGA).

The control unit 130 includes a display control unit 131, an acceptance unit 132, an association unit 133, and a calculation unit 134 and realizes or executes functions or actions of information processing which will be described below. It is noted that an internal configuration of the control unit 130 is not limited to the configuration illustrated in FIG. 1, and another configuration may also be adopted as long as the information processing which will be described below is performed. The control unit 130 also respectively stores the input captured image and the CAD data from the input and output unit 113 in the captured image storage unit 121 and the CAD data storage unit 122. It is noted that the control unit 130 may obtain the captured image and the CAD data from another information processing apparatus via the communication unit 110 instead of the input of the captured image and the CAD data from the input and output unit 113.

When the application for performing the display control processing is activated by the user operation, for example, the display control unit 131 displays an application screen on the display unit 111. When the display of the captured image is instructed by the user operation, the display control unit 131 refers to the captured image storage unit 121 on the application screen and obtains the captured image, for example. The display control unit 131 extracts edge lines from the obtained captured image. The display control unit 131 displays the obtained captured image and the extracted edge lines on the application screen in a state in which the edge lines can be selected.

The display control unit 131 also refers to the CAD data storage unit 122 and obtains the CAD data. When the display of the model of the CAD data is instructed by the user operation on the application screen, for example, the display control unit 131 refers to the CAD data storage unit 122 and obtains the CAD data. The display control unit 131 generates a model based on the obtained CAD data and displays the generated model on the application screen. It is noted that the generated model includes ridge lines indicating an outer shape of the model, and the ridge lines are displayed in a state in which the ridge lines can be selected.

That is, the display control unit 131 displays the plurality of edge lines extracted from the captured image including the structure which is shot by the imaging apparatus and the plurality of ridge lines included in the model in accordance with the structure data of the structure on the application screen, that is, the display unit 111, in a manner that those lines can be selected. When the display control unit 131 displays the captured image and the model on the application screen, an acceptance instruction is output to the acceptance unit 132.

It is noted that the display control unit 131 uses straight lines as the edge lines to be extracted and the ridge lines of the model, for example. That is, the display control unit 131 displays the plurality of edge lines corresponding to the straight lines extracted from the captured image and the plurality of ridge lines corresponding to the straight lines included in the model in a manner that those lines can be selected.

When the model after an adjustment is input from the calculation unit 134, the display control unit 131 displays the model after the adjustment on the application screen such that the respective selected edge lines of the captured image and the respective selected ridge lines of the model after the adjustment are overlapped with each other. That is, the display control unit 131 overlaps and displays the model on the captured image in an orientation in which the respective positions of the predetermined number of ridge lines correspond to the positions of the edge lines associated with the ridge lines. In other words, when the model after the adjustment is input from the calculation unit 134, the display control unit 131 superimposes and displays the input model after the adjustment to be aligned with the structure on the captured image on the application screen. For example, the display control unit 131 saves the application screen where the superimposed display is being performed in the memory card of the input and output unit 113 by the user instruction as the superimposed image. It is noted that the display control unit 131 and the calculation unit 134 are examples of a superimposed display unit.

When the acceptance instruction is input from the display control unit 131, the acceptance unit 132 accepts the selection of the edge lines of the captured image and the selection of the ridge lines of the model from the user. When operation information of the selection operation by the user is input from the operation unit 112, the acceptance unit 132 accepts the selection of the edge lines of the captured image or the selection of the ridge lines of the model in accordance with the operation information. That is, the acceptance unit 132 accepts the selection of the predetermined number of edge lines among the plurality of edge lines displayed on the display unit 111 and the selection of the predetermined number of ridge lines among the plurality of displayed ridge lines. The acceptance unit 132 associates the selection order with the identifier of the edge line or ridge line with regard to each of the edge lines and the ridge lines to be output to the association unit 133.

When the associated selection orders and the identifiers of the edge lines and associated selection orders and the identifiers of the ridge lines are input from the acceptance unit 132, the association unit 133 associates the identifier of the edge line with the identifier of the ridge line based on the input selection order. That is, the association unit 133 associates the predetermined number of respective edge lines with the predetermined number of respective ridge lines based on the respective selection orders of the predetermined number of selected edge lines and the respective selection orders of the predetermined number of selected ridge lines. It is noted that the associated respective edge lines and ridge lines will be referred as edge pairs in the following descriptions. That is, the association unit 133 associates the identifiers of the input edge lines with the identifiers of the ridge lines based on the selection orders to be respectively set as the edge pairs. The association unit 133 stores the associated selection orders, and the identifiers of the edge lines and the identifiers of the ridge lines, that is, the edge pairs, in the selection order storage unit 123.

The association unit 133 refers to the selection order storage unit 123 and determines whether or not four pairs of the edge pairs are stored, that is, whether or not the four pairs of the edge pairs are selected. In a case where the four pairs of the edge pairs are not selected, the association unit 133 instructs the acceptance unit 132 to continuously accept the selection of the edge lines and the selection of the ridge lines. It is noted that, in a case where five or more pairs of the edge pairs are stored in the selection order storage unit 123, the association unit 133 can set arbitrary four pairs as selected edge pairs. In a case where the four pairs of the edge pairs are selected, the association unit 133 outputs a calculation instruction to the calculation unit 134.

Figure 3:
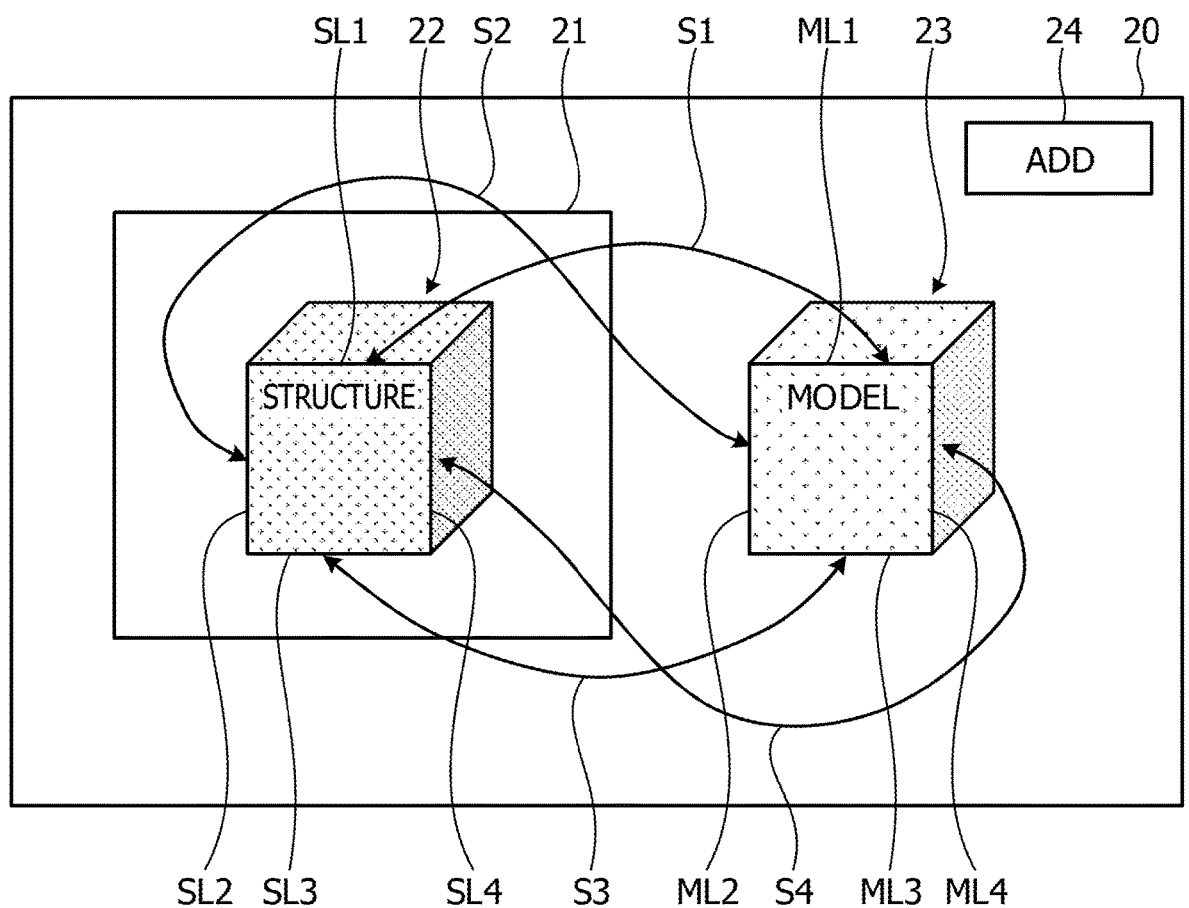
FIG. 3 illustrates an example of an operation in a selection of edge lines and ridge lines according to a related art technology.

Here, the selection of the edge lines and the ridge lines will be described with reference to FIGS. 3 and 4. FIG. 3 illustrates an example of an operation in the selection of the edge lines and the ridge lines according to a related art technology. A display screen 20 illustrated in FIG. 3 is an example of a screen for selecting the edge lines and the ridge lines according to a related art technology. The display screen 20 includes a region 21 where the captured image is displayed, and a structure 22 is displayed in the region 21. In addition, a model 23 corresponding to the structure 22 and an add button 24 for adding the edge pair are displayed on the display screen 20.

In this case, in order that the user selects the four edge pairs, first, the user performs operations three times including selecting an edge line SL1 of the structure 22, selecting a ridge line ML1 of the model 23, and pressing the add button 24 as the first edge pair (step S1). Next, the user performs operations three times including selecting an edge line SL2 of the structure 22, selecting a ridge line ML2 of the model 23, and pressing the add button 24 as the second edge pair (step S2). Next, the user performs operations three times including selecting an edge line SL3 of the structure 22, selecting a ridge line ML3 of the model 23, and pressing the add button 24 as the third edge pair (step S3). Next, the user performs operations three times including selecting an edge line SL4 of the structure 22, selecting a ridge line ML4 of the model 23, and pressing the add button 24 as the fourth edge pair (step S4). That is, the user performs the operations 3 times×4 pairs=12 times to select the four edge pairs.

In contrast to this, the selection of the edge lines and the ridge lines in the present application will be described with reference to FIG. 4. FIG. 4 illustrates an example of the operation in the selection of the edge lines and the ridge lines according to the exemplary embodiment. A display screen 30 illustrated in FIG. 4 is an example of a screen for selecting the edge lines and the ridge lines in the present application. The display screen 30 includes a region 31 where the captured image is displayed, and a structure 32 is displayed in the region 31. In addition, a model 33 corresponding to the structure 32 and an add button 34 for adding the edge pair are displayed on the display screen 30.

In this case, in order that the user selects the four edge pairs, first, the user performs an input by a single stroke (drawing a trajectory) while a left click button of the mouse is pressed such that a mouse cursor sequentially passes through neighborhoods of the edge lines SL11, SL12, and SL13 of the structure 32, for example. Next, the user performs an input by a single stroke while the left click button of the mouse is pressed such that the mouse cursor sequentially passes through neighborhoods of the ridge lines ML11, ML12, and ML13 of the model 33, for example, and presses the add button 34. That is, the user performs operations three times including selecting the edge lines SL11 to SL13, selecting the ridge lines ML11 to ML13, and pressing the add button 34 (step S11). Next, the user performs operations three times including selecting the edge line SL14 of the structure 32, selecting the ridge line ML14 of the model 33, and pressing the add button 34 (step S12). That is, the user performs the operations 3 times+3 times=6 times to select the four edge pairs.

In other words, the acceptance unit 132 accepts the selection of the predetermined number of edge lines or the selection of the predetermined number of ridge lines in passing orders of the cursor passing through the neighborhoods of the plurality of edge lines or ridge lines. In this manner, since the number of times to perform the operations for associating the edge lines of the structure with the ridge lines of the model can be reduced from 12 times to 6 times as compared with the operations according to the related art technology, the display control apparatus 100 of the present application can facilitate the association between the edge lines extracted from the image and the ridge lines of the model.

Figure 4:
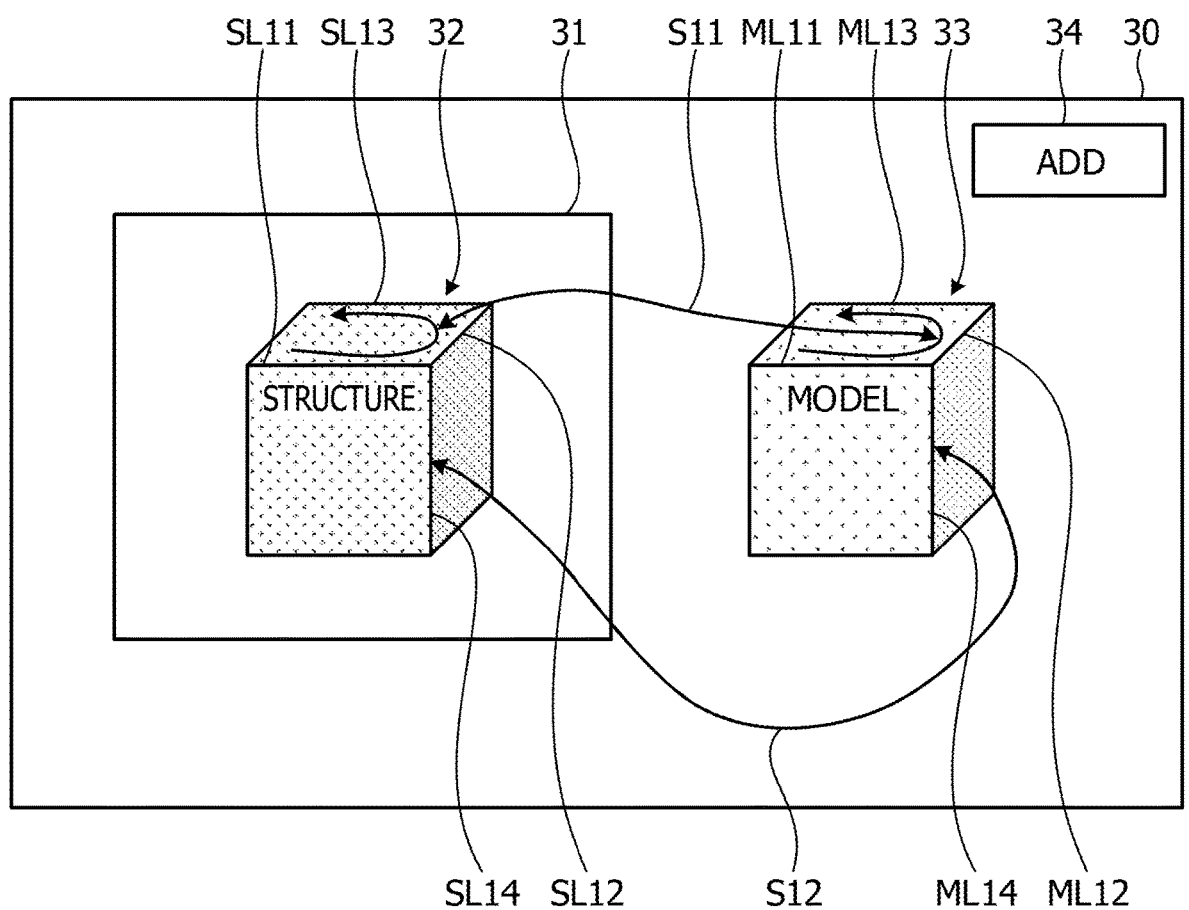
FIG. 4 illustrates an example of the operation in the selection of the edge lines and the ridge lines according to the exemplary embodiment.

It is noted that a configuration may be adopted in which the edge lines SL11, SL12, SL13, and SL14 of the structure 32 are sequentially selected, the ridge line ML11, ML12, ML13, and ML14 of the model 33 are sequentially selected, and the add button 34 is pressed in the example of FIG. 4 without performing the single stroke. In this case, the user performs the operations 4 times+4 times+1 time=9 times. In other words, the acceptance unit 132 accepts the selection of the predetermined number of edge lines or the selection of the predetermined number of ridge lines in clicking orders of the plurality of edge lines or ridge lines. In this case, since the number of times to perform the operation for associating the edge lines of the structure with the ridge lines of the model can be reduced from 12 times to 9 times as compared with the operations according to the related art technology, the display control apparatus 100 of the present application can facilitate the association between the edge lines extracted from the image and the ridge lines of the model.

Descriptions will be provided with reference to FIG. 1 again. When the calculation instruction is input from the association unit 133, the calculation unit 134 refers to the selection order storage unit 123 and reads out the four edge pairs to calculate a translation rotation matrix of the model. The calculation unit 134 adjusts the size of the model and performs three-dimensional translation and rotation such that the respective ridge lines of the model are overlapped with the respective corresponding edge lines of the captured image based on the calculated translation rotation matrix. The calculation unit 134 outputs the model after the adjustment to the display control unit 131. That is, the calculation unit 134 adjusts the position, the size, and the orientation of the model based on the calculated translation rotation matrix and outputs the model after the adjustment to the display control unit 131.

Figure 5:
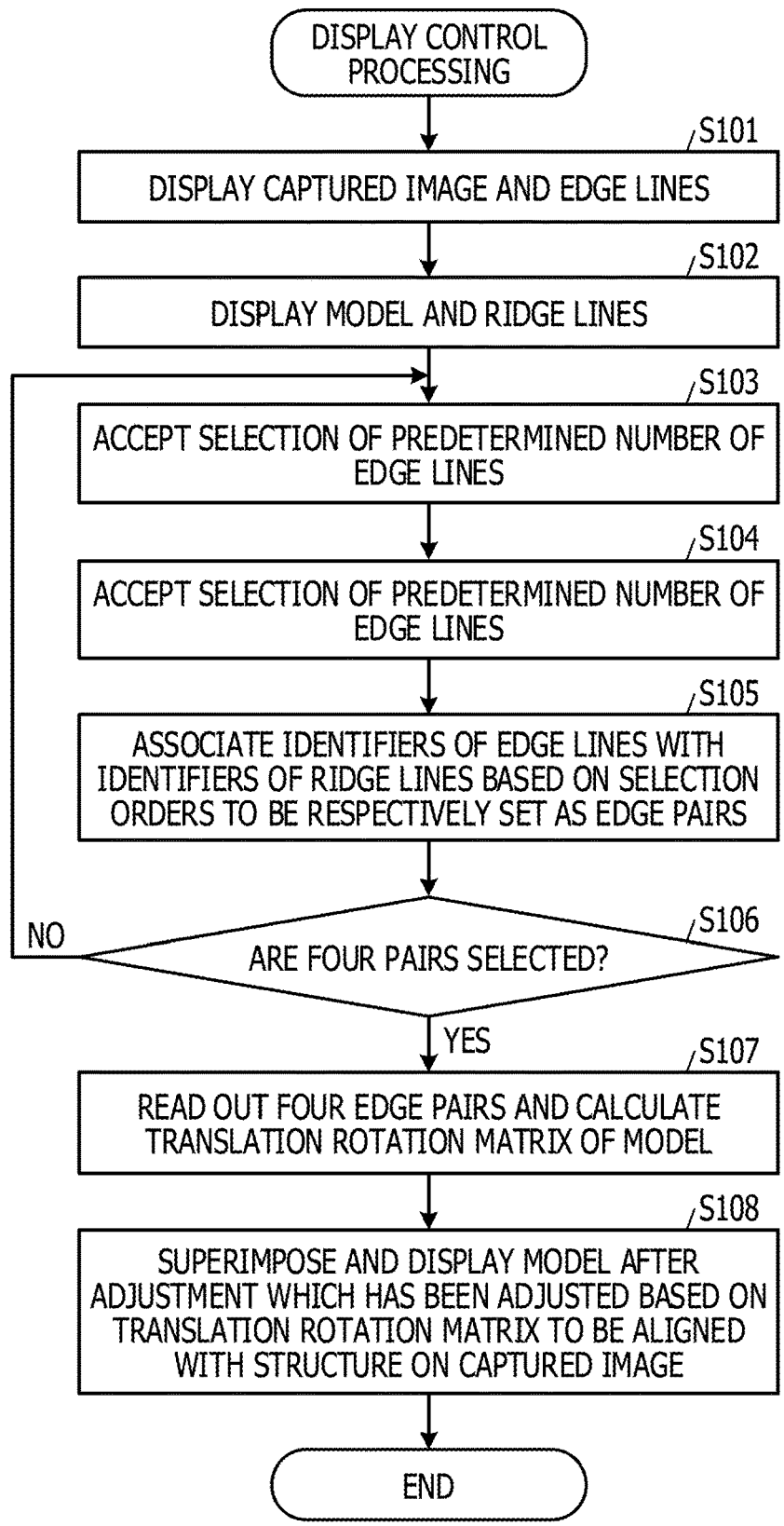
FIG. 5 is a flow chart illustrating an example of display control processing according to the exemplary embodiment.

Next, an operation of the display control apparatus 100 according to the exemplary embodiment will be described. FIG. 5 is a flow chart illustrating an example of display control processing according to the exemplary embodiment.

When an application for performing the display control processing is activated by the user operation, the display control unit 131 displays the application screen on the display unit 111, for example. When the display control unit 131 displays the application screen, the captured image is obtained from the captured image storage unit 121 by the instruction of the user to extract the edge lines. The display control unit 131 displays the obtained captured image and the extracted edge lines on the application screen (step S101).

The display control unit 131 refers to the CAD data storage unit 122 and obtains the CAD data. The display control unit 131 generates a model based on the obtained CAD data and displays the generated model on the application screen (step S102). That is, the display control unit 131 displays the model and the ridge lines included in the model on the application screen. When the captured image and the model are displayed on the application screen, the display control unit 131 outputs an acceptance instruction to the acceptance unit 132.

When the acceptance instruction is input from the display control unit 131, the acceptance unit 132 accepts the selection of the edge lines of the captured image and the selection of the ridge lines of the model from the user. First, the acceptance unit 132 accepts the selection of the predetermined number, for example, three edge lines among the edge lines of the captured image (step S103). Subsequently, the acceptance unit 132 accepts the selection of the predetermined number, for example, three ridge lines among the ridge lines of the model (step S104). The acceptance unit 132 associates the selection order with the identifier of the edge line or ridge line with regard to each of the edge lines and the ridge lines to be output to the association unit 133.

The associated selection orders and the identifiers of the edge lines and the associated selection orders and the identifiers of the ridge lines are input to the association unit 133 from the acceptance unit 132. The association unit 133 respectively associates the input identifiers of the edge lines with the input identifiers of the ridge lines based on the selection orders to be set as the edge pairs (step S105). The association unit 133 stores the associated selection orders, and the identifiers of the edge lines and the identifiers of the ridge lines, that is, the edge pairs in the selection order storage unit 123.

The association unit 133 refers to the selection order storage unit 123 and determines whether or not the four pairs of the edge pairs are selected (step S106). In a case where the four pairs of the edge pairs are not selected (step S106: No), the association unit 133 returns to step S103 and instructs the acceptance unit 132 to continuously accept the selection of the edge lines and the selection of the ridge lines. In a case where the four pairs of the edge pairs are selected (step S106: Yes), the association unit 133 outputs the calculation instruction to the calculation unit 134.

When the calculation instruction is input from the association unit 133, the calculation unit 134 refers to the selection order storage unit 123 and reads out the four edge pairs to calculate the translation rotation matrix of the model (step S107). The calculation unit 134 adjusts the position, the size, and the orientation of the model based on the calculated translation rotation matrix and outputs the model after the adjustment to the display control unit 131.

When the model after the adjustment is input from the calculation unit 134, the display control unit 131 superimposes and displays the input model after the adjustment to be aligned with the structure on the captured image on the application screen (step S108). The display control unit 131 saves the application screen where the superimposed display is being performed in the memory card of the input and output unit 113 as the superimposed image and ends the display control processing by the user instruction, for example. With this configuration, the display control apparatus 100 can facilitate the association between the edge lines extracted from the image and the ridge lines of the model. That is, the display control apparatus 100 can facilitate the association of the edge lines extracted from the captured image with the ridge lines included in the model in accordance with the structure data.

Figure 6:
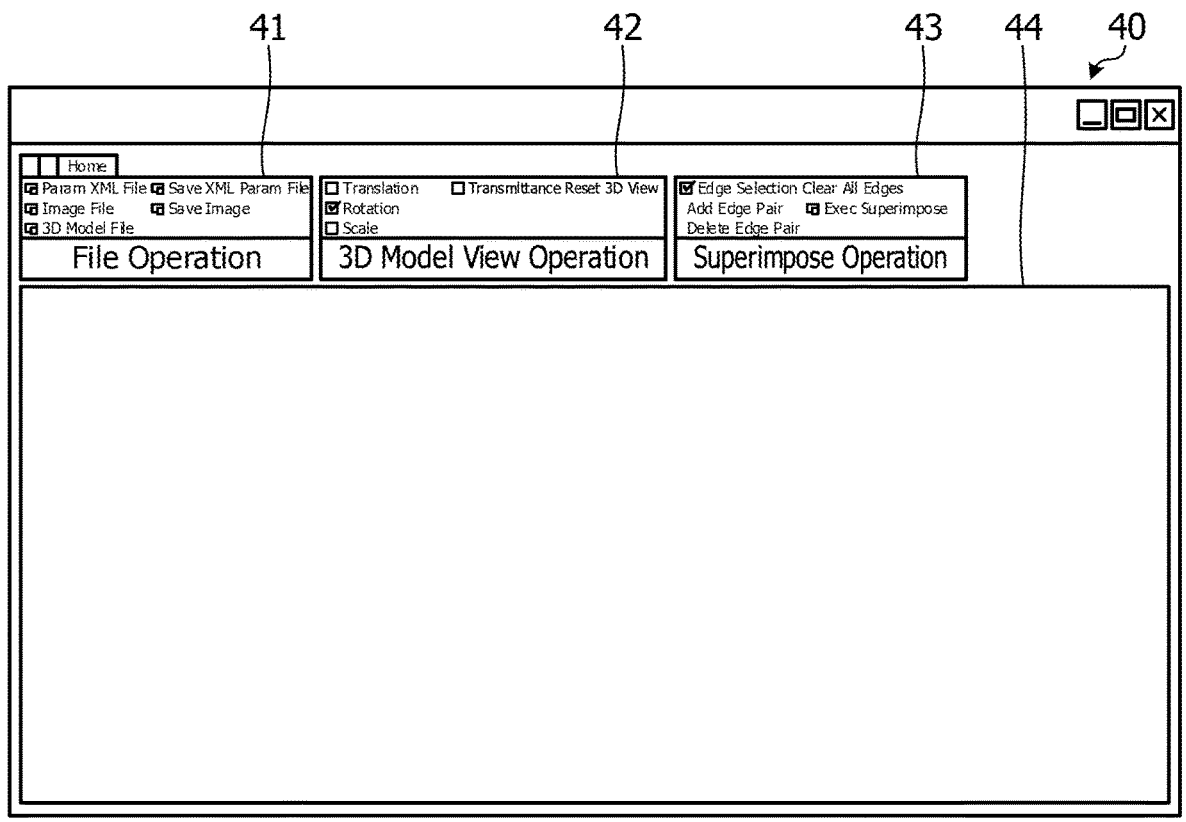
FIG. 6 illustrates an example of an application screen immediately after activation.

Subsequently, a specific example of the display control processing will be described with reference to FIGS. 6 to 12. FIG. 6 illustrates an example of an application screen immediately after activation. As illustrated in FIG. 6, the application screen 40 includes an operation region 41 related to a file, an operation region 42 related to the three-dimensional display of the model, an operation region 43 related to the superimposed display, and a display region 44 where the captured image and the model are displayed. The operation region 41 is operated to specify the captured image to be read by the user on the application screen 40.

Figure 7:
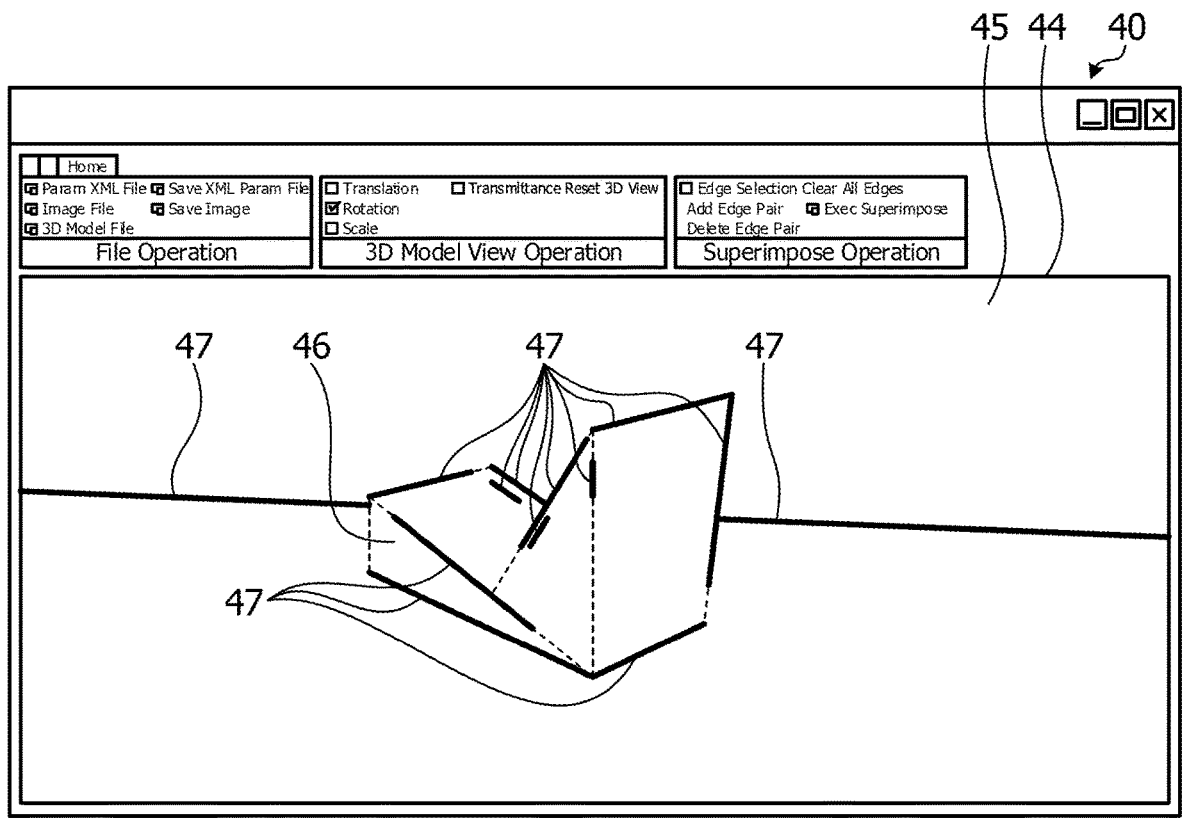
FIG. 7 illustrates examples of a captured image and extracted edge lines.

FIG. 7 illustrates examples of a captured image and extracted edge lines. FIG. 7 illustrates a state in which a read captured image 45 is displayed in the display region 44. The captured image 45 includes a structure 46. In addition, a plurality of edge lines 47 extracted from the captured image 45 are displayed in the display region 44. The operation region 41 is operated to specify the CAD data to be read by the user on the application screen 40 illustrated in FIG. 7.

Figure 8:
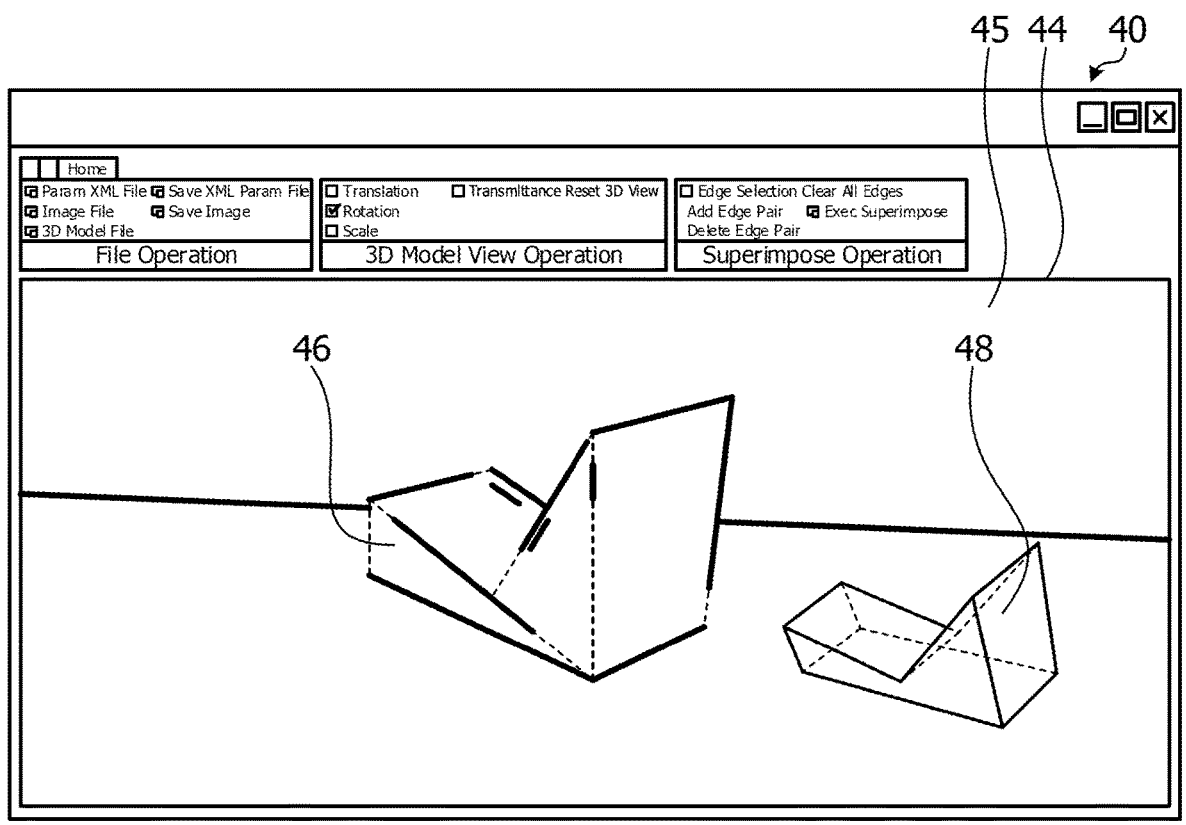
FIG. 8 illustrates an example of a model corresponding to a structure.

FIG. 8 illustrates an example of a model corresponding to a structure. FIG. 8 illustrates a state in which a model 48 based on the specified CAD data is superimposed and displayed with respect to the captured image 45 at an arbitrary position in the display region 44. That is, in FIG. 8, the structure 46 and the model 48 corresponding to the structure 46 are displayed in the display region 44.

Figure 9:
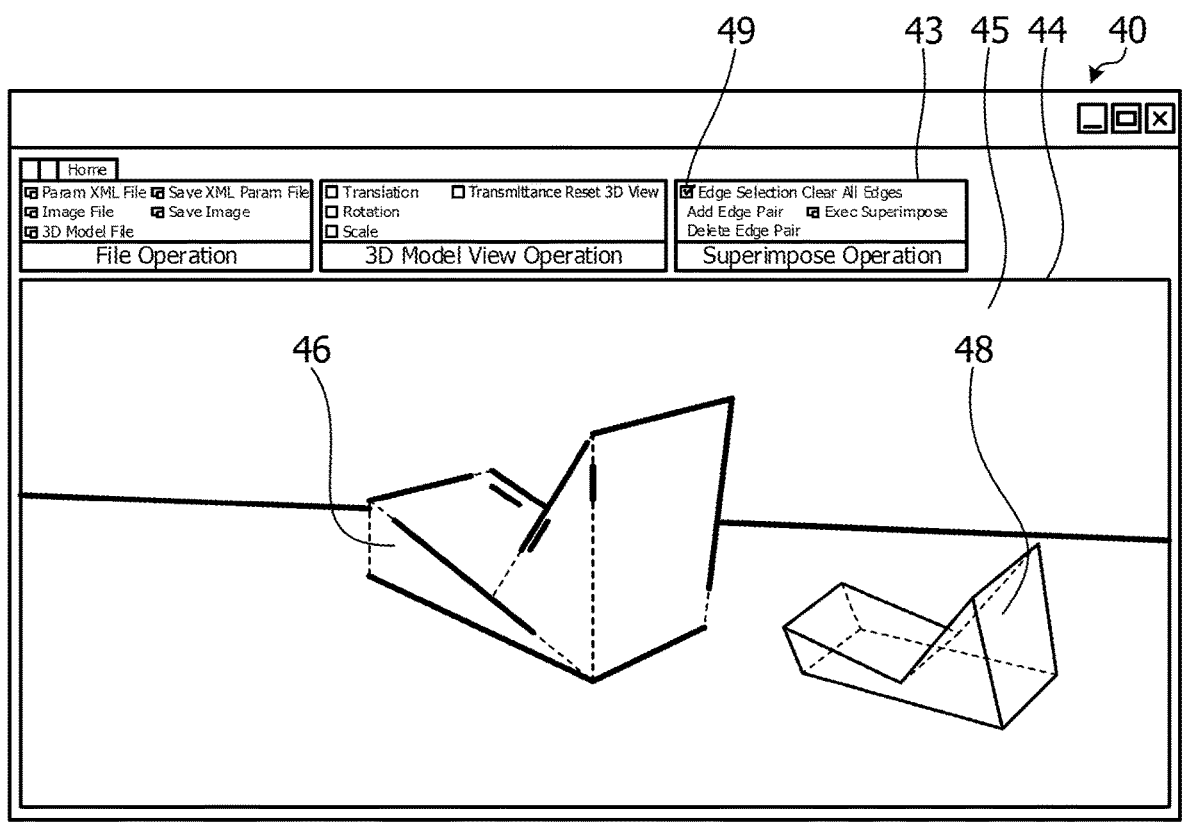
FIG. 9 illustrates an example of a state in which a selection of edge pairs is started.

FIG. 9 illustrates an example of a state in which the selection of edge pairs is started. FIG. 9 illustrates a state in which a check box 49 for starting the selection of the edge pair in the operation region 43 is checked on the application screen 40. A state is established in FIG. 9 in which the edge lines and the ridge lines of the structure 46 and the model 48 can be selected.

Figure 10:
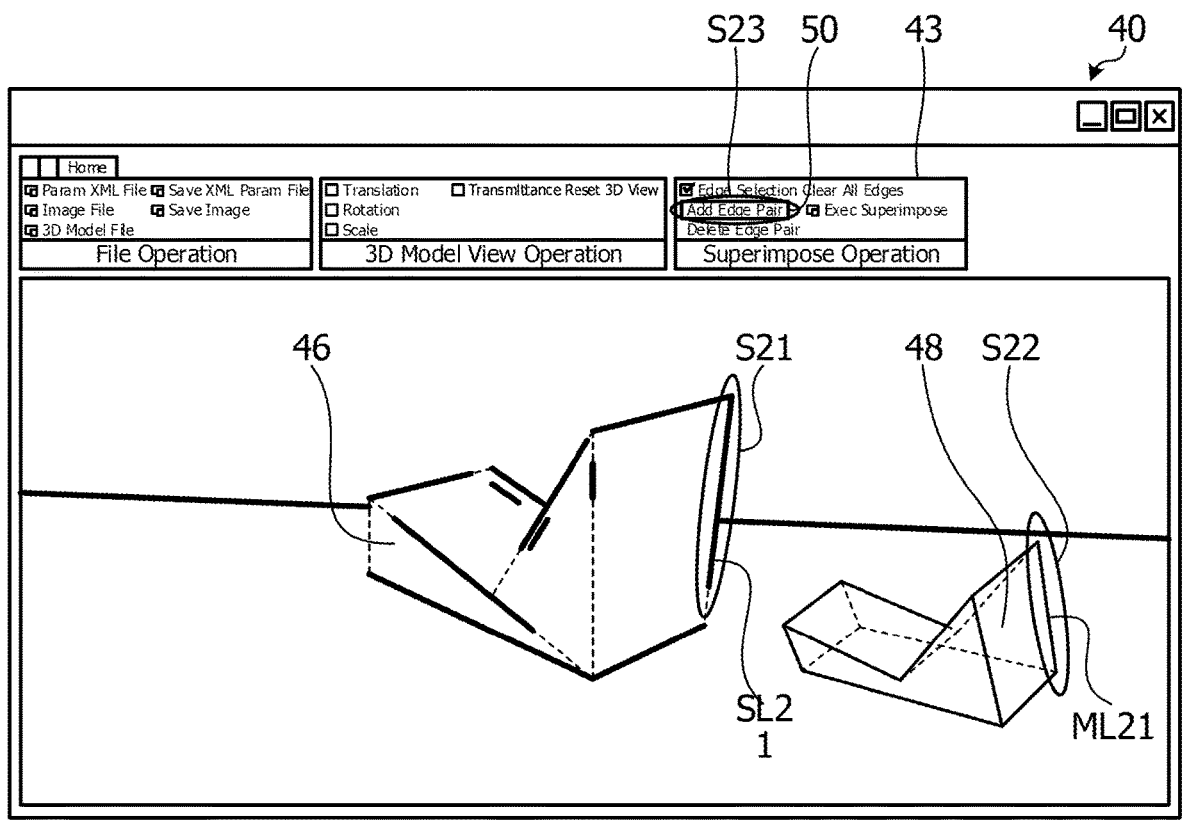
FIG. 10 illustrates an example of the selection of a first pair.

FIG. 10 illustrates an example of the selection of a first pair. In FIG. 10, the operations are performed in the stated order of steps S21, S22, and S23 to select the edge pair of the first pair. The user selects an edge line SL21 of the structure 46 on the application screen 40 (step S21). Next, the user selects a ridge line ML21 of the model 48 on the application screen 40 (step S22). Thereafter, the user presses an add button 50 of the operation region 43 on the application screen 40 (step S23). With this configuration, the display control apparatus 100 associates the edge line SL21 and the ridge line ML21 with the selection order "1" to be stored in the selection order storage unit 123.

Figure 11:
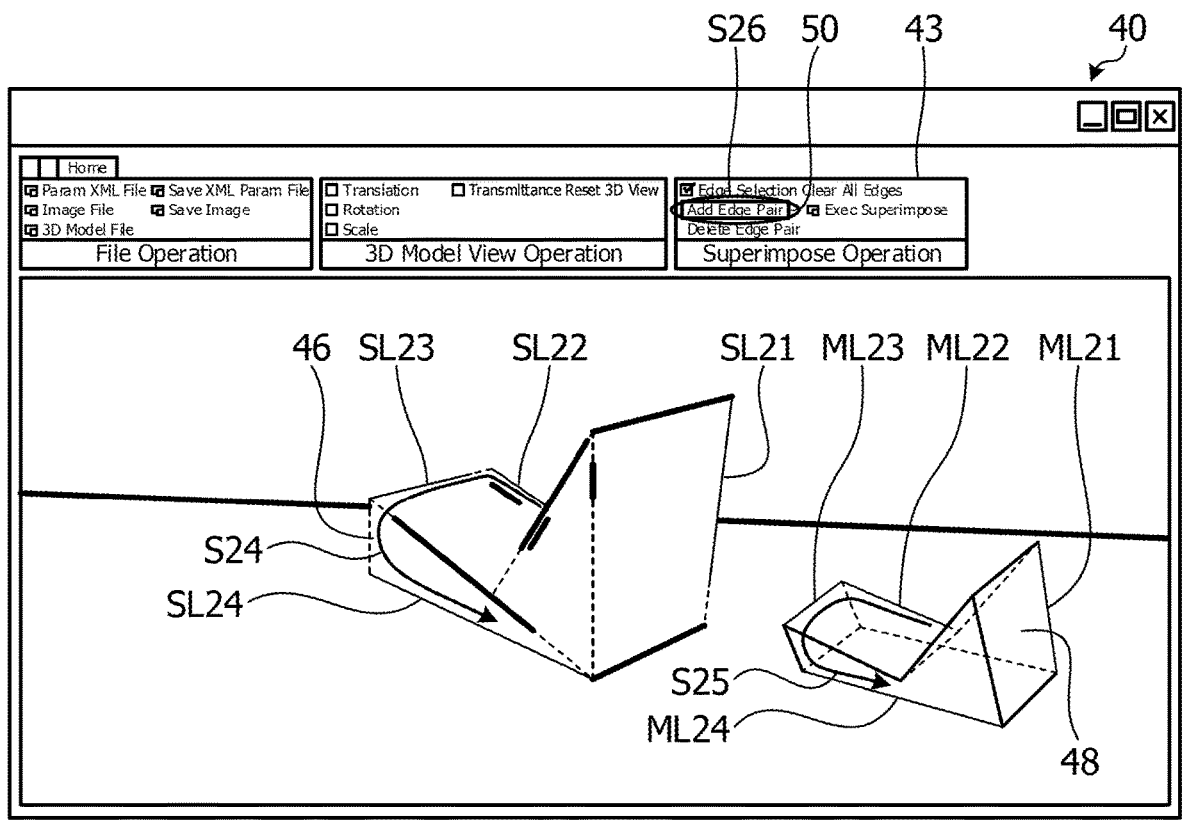
FIG. 11 illustrates an example of a state in which the selection of four pairs is completed.

FIG. 11 illustrates an example of a state in which the selection of four pairs is completed. In FIG. 11, the operations are performed in the stated order of steps S24, S25, and S26 to select the edge pairs of the second to fourth pairs. The user performs an input such that the mouse cursor sequentially passes through neighborhoods of edge lines SL22, SL23, and SL24 of the structure 46 on the application screen 40 (step S24). Next, the user performs an input such that the mouse cursor sequentially passes through neighborhoods of ridge lines ML22, ML23, and ML24 of the model 48 on the application screen 40 (step S25). Thereafter, the user presses the add button 50 of the operation region 43 on the application screen 40 (step S26). With this configuration, the display control apparatus 100 respectively associates the edge line SL22 and the ridge line ML22 with the selection order "2", the edge line SL23 and the ridge line ML23 with the selection order "3", and the edge line SL24 and the ridge line ML24 with the selection order "4" to be stored in the selection order storage unit 123.

Figure 12:
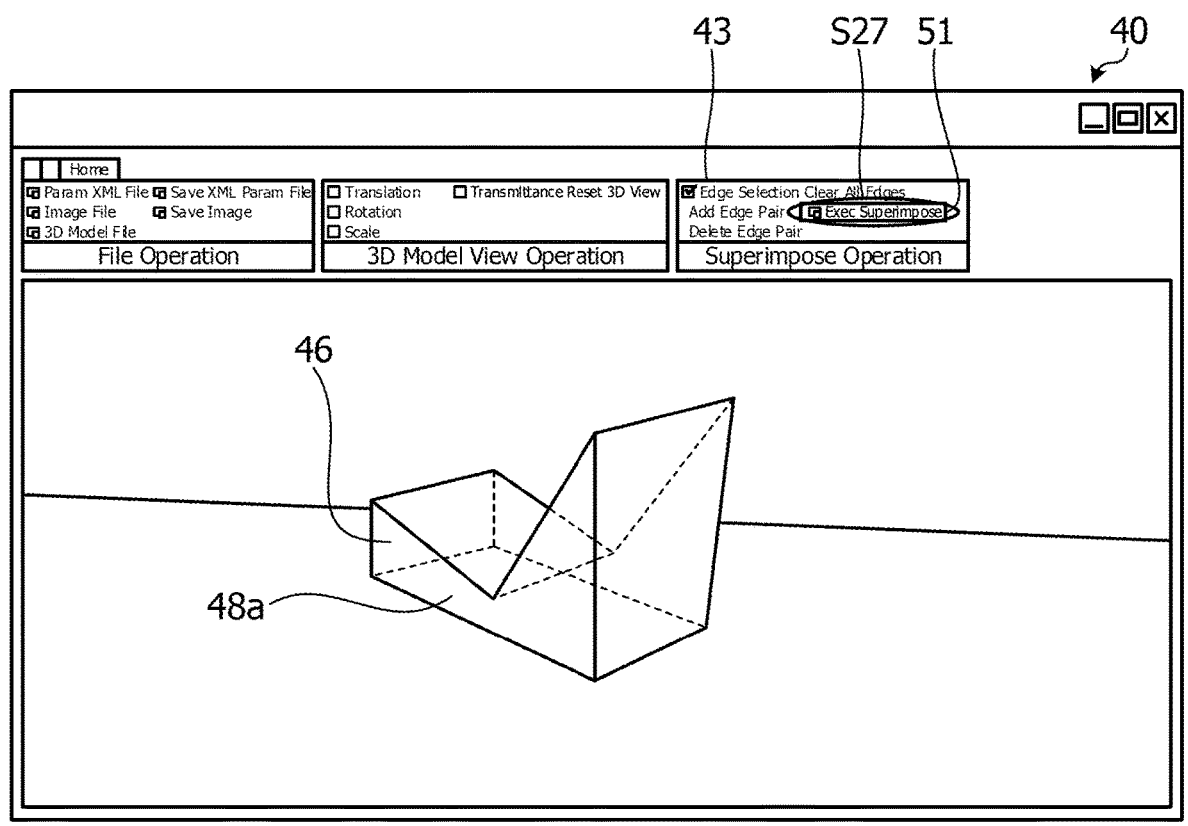
FIG. 12 illustrates an example of a state in which the model is overlapped with the structure on the captured image.

FIG. 12 illustrates an example of a state in which the model is overlapped with the structure on the captured image. FIG. 12 illustrates a state in which the structure 46 and a model 48a after the adjustment where the position, the size, and the orientation are adjusted are superimposed on each other to be displayed when the user presses a superimposed display button 51 in the operation region 43 in the state of FIG. 11 (step S27). That is, a state is established in FIG. 12 in which the translation rotation matrix is calculated from the four edge pairs associated by the operations in FIGS. 7 to 11, and the superimposed display of the model 48a after the adjustment which is adjusted based on the translation rotation matrix is performed while being aligned with the structure 46 on the captured image. In this manner, the display control apparatus 100 can facilitate the association between the edge lines extracted from the image and the ridge lines of the model.

It is noted that the captured image which has been previously shot is obtained according to the above-mentioned exemplary embodiment, but the configuration is not limited to this. For example, the display control apparatus 100 may be provided with an imaging apparatus, and the model based on the CAD data of the structure may be adjusted for the superimposed display on the structure included in the captured image shot by the display control apparatus 100.

In this manner, the display control apparatus 100 displays the plurality of edge lines extracted from the captured image including the structure which is shot by the imaging apparatus and the plurality of ridge lines included in the model in accordance with the structure data of the structure in a manner that those lines can be selected. The display control apparatus 100 also accepts the selection of the predetermined number of edge lines among the plurality of displayed edge lines and the selection of the predetermined number of ridge lines among the plurality of displayed ridge lines. In addition, the display control apparatus 100 associates the predetermined number of respective edge lines with the predetermined number of respective ridge lines based on the respective selection orders of the predetermined number of selected edge lines and the respective selection orders of the predetermined number of selected ridge lines. Moreover, the display control apparatus 100 superimposes and displays the model on the captured image in the orientation in which the respective positions of the predetermined number of ridge lines correspond to the positions of the edge lines associated with the ridge lines. As a result, the display control apparatus 100 can facilitate the association between the edge lines extracted from the image and the ridge lines of the model.

The display control apparatus 100 also accepts the selection of the predetermined number of edge lines or the selection of the predetermined number of ridge lines in the passing orders of the cursor passing through the neighborhoods of the plurality of edge lines or ridge lines. As a result, the display control apparatus 100 can reduce the number of times for the user to perform the operations to select the edge lines and the ridge lines.

The display control apparatus 100 also accepts the selection of the predetermined number of edge lines or the selection of the predetermined number of ridge lines in the clicking orders of the plurality of edge lines or ridge lines. As a result, the display control apparatus 100 can reduce the number of times for the user to perform the operations to select the edge lines and the ridge lines.

In addition, the display control apparatus 100 displays the plurality of edge lines corresponding to the straight lines extracted from the captured image and the plurality of ridge lines corresponding to the straight lines included in the model in a manner that those lines can be selected. As a result, the display control apparatus 100 can perform the superimposed display of the model of the structure on the structure on the captured image while the edge lines and the ridge lines corresponding to the straight lines are set as a reference.

Moreover, the respective components of the respective illustrated units may physically take configurations other than the illustrated configurations. That is, specific modes of dispersions and integrations of the respective units are not limited to the illustrated configurations, and it is possible to adopt a configuration in which all or part of the units are functionally or physically dispersed or integrated in arbitrary units in accordance with various loads and use statuses. For example, the acceptance unit 132 and the association unit 133 may be integrated with each other. In addition, the respective illustrated processings are not limited to the above-mentioned orders and may be executed at the same time or executed while the orders are swapped within a range without producing contradictions in processing contents.

Furthermore, all or arbitrary part of the various processing functions performed in the respective apparatuses may be performed on a CPU (or a microcomputer such as an MPU or a micro controller unit (MCU). In addition, all or arbitrary part of the various processing functions may of course be executed on a program analyzed and executed by the CPU (or the microcomputer such as the MPU or the MCU) or executed on hardware based on a wired logic.

Figure 13:
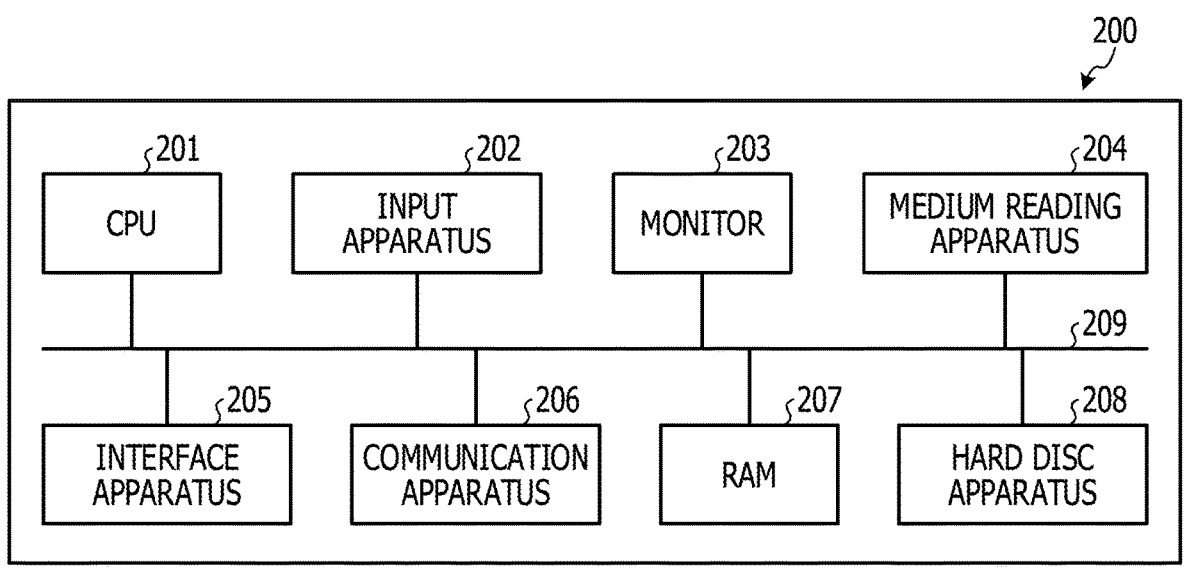
FIG. 13 illustrates an example of a computer that executes a display control program.

Incidentally, the various processings described according to the above-mentioned exemplified embodiment can be realized while a previously prepared program is executed by a computer. In view of the above, an example of the computer that executes the program having similar functions to those of the above-mentioned exemplified embodiment will be described below. FIG. 13 illustrates an example of a computer that executes a display control program.

As illustrated in FIG. 13, a computer 200 includes a CPU 201 that executes various arithmetic operation processings, an input apparatus 202 that accepts a data input, and a monitor 203. The computer 200 also includes a medium reading apparatus 204 that reads the program or the like from a storage medium, an interface apparatus 205 that establishes connections with various apparatuses, and a communication apparatus 206 that establishes a connection to another information processing apparatus or the like in a wired or wireless manner. The computer 200 also includes a RAM 207 that temporarily stores various information and a hard disc apparatus 208. The respective apparatuses 201 to 208 are connected to a bus 209.

The hard disc apparatus 208 stores a display control program having similar functions to those of the respective processing units including the display control unit 131, the acceptance unit 132, the association unit 133, and the calculation unit 134 illustrated in FIG. 1. The hard disc apparatus 208 also stores various data for realizing the captured image storage unit 121, the CAD data storage unit 122, the selection order storage unit 123, and the display control program. The input apparatus 202 accepts, for example, an input of various information such as the operation information from a user of the computer 200. The monitor 203 displays, for example, various screens such as a display screen with respect to the user of the computer 200. The medium reading apparatus 204 reads various data such as the captured image and the CAD data. A printing apparatus or the like is connected to the interface apparatus 205, for example. The communication apparatus 206 is connected, for example, to a network (not illustrated) which has similar functions to the communication unit 110 illustrated in FIG. 1 and exchanges various information with the other information processing apparatus (not illustrated).

The CPU 201 reads out the respective programs stored in the hard disc apparatus 208 to be developed into the RAM 207 for execution, so that various processings are performed. These programs can also cause the computer 200 to function as the display control unit 131, the acceptance unit 132, the association unit 133, and the calculation unit 134 illustrated in FIG. 1.

It is noted that the above-mentioned display control program may be stored in an apparatus other than the hard disc apparatus 208. For example, a program stored in a storage medium that can be read by the computer 200 may be read out by the computer 200 to be executed. The storage medium that can be read by the computer 200 corresponds, for example, to a CD-ROM or a DVD disc, a portable recording medium such as a universal serial bus (USB) memory, a semiconductor memory such as a flash memory, a hard disc drive, and the like. This display control program may also be stored in an apparatus connected to the public line, the internet, a LAN, or the like, and the display control program may be read out from these memories by the computer 200 to be executed.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A non-transitory computer-readable storage medium storing a program that causes a computer to execute a process, the process comprising:

displaying, on a screen, a plurality of first edge lines extracted from a captured image including a structure captured by a camera and a plurality of second edge lines included in a three dimensional model corresponding to structure data of the structure, the plurality of first edge lines and the plurality of second edge lines being selectable by using a input device for the screen;

determining target first edge lines and a first sequential order in accordance with a first operation obtained from the input device, the target first edge lines being included in the plurality of first edge lines, the first sequential order indicating a sequence of the target first edge lines arranged in an order in which each of the target first edge lines is selected by the first operation;

determining target second edge lines and a second sequential order in accordance with a second operation obtained from the input device, the target second edge lines being included in the plurality of second edge lines, the second sequential order indicating a sequence of the target second edge lines arranged in an order in which each of the target second lines is selected by the second operation, a number of the second sequential order corresponding to a number of the first sequential order;

associating, for each of the target second edge lines arranged in the second sequential order, a target second edge line with a target first edge line, the target second edge line being one of the target second edge lines, the target first edge line being one of the target first edge lines arranged in the first sequential order, both the target first edge line and the target second edge line being in a same rank between the first sequential order and the second sequential order; and superimposing, on the screen, the three dimensional model with the structure in the captured image in accordance with a result of the associating.

2. The non-transitory computer-readable storage medium according to claim 1, wherein
the target first edge lines and the first sequential order are determined based on a trajectory of the first operation that is a first single stroke to the structure; and wherein
the target second edge lines and the second sequential order are determined based on a trajectory of the second operation is a second single stroke to the three dimensional model.

3. The non-transitory computer-readable storage medium according to claim 2, wherein
the target first edge lines and the first sequential order are determined based on passing orders of the first single stroke through neighborhoods of the plurality of first edge lines; and wherein
the target second edge lines and the second sequential order are determined based on passing orders of the second single stroke through neighborhoods of the plurality of second edge lines.

4. The non-transitory computer-readable storage medium according to claim 1, wherein
the target first edge lines and the first sequential order are determined based on a click order of the first operation that is click operations to the plurality of first edge lines; and wherein
the target second edge lines and the second sequential order are determined based on a click order of the second operation that is click operations to the plurality of second edge lines.

5. The non-transitory computer-readable storage medium according to claim 1, wherein
the plurality of first edge lines includes at least one straight line extracted from the captured image; and wherein
the plurality of second edge lines includes at least one straight line included in the three dimensional model.

6. A display control method executed by a computer, the display control method comprising:

displaying, on a screen, a plurality of first edge lines extracted from a captured image including a structure captured by a camera and a plurality of second edge lines included in a three dimensional model corresponding to structure data of the structure, the plurality of first edge lines and the plurality of second edge lines being selectable by using a input device for the screen;

determining target first edge lines and a first sequential order in accordance with a first operation obtained from the input device, the target first edge lines being included in the plurality of first edge lines, the first sequential order indicating a sequence of the target first edge lines arranged in an order in which each of the target first edge lines is selected by the first operation;

determining target second edge lines and a second sequential order in accordance with a second operation obtained from the input device, the target second edge lines being included in the plurality of second edge lines, the second sequential order indicating a sequence of the target second edge lines arranged in an order in which each of the target second lines is selected by the second operation, a number of the second sequential order corresponding to a number of the first sequential order;

associating, for each of the target second edge lines arranged in the second sequential order, a target second edge line with a target first edge line, the target second edge line being one of the target second edge lines, the target first edge line being one of the target first edge lines arranged in the first sequential order, both the target first edge line and the target second edge line being in a same rank between the first sequential order and the second sequential order; and superimposing, on the screen, the three dimensional model with the structure in the captured image in accordance with a result of the associating.

7. A display control apparatus comprising:
a memory; and
a processor coupled to the memory and the processor configured to execute a process, the process including:
displaying, on a screen, a plurality of first edge lines extracted from a captured image including a structure captured by a camera and a plurality of second edge lines included in a three dimensional model corresponding to structure data of the structure, the plurality of first edge lines and the plurality of second edge lines being selectable by using a input device for the screen;

determining target first edge lines and a first sequential order in accordance with a first operation obtained from the input device, the target first edge lines being included in the plurality of first edge lines, the first sequential order indicating a sequence of the target first edge lines arranged in an order in which each of the target first edge lines is selected by the first operation;

determining target second edge lines and a second sequential order in accordance with a second operation obtained from the input device, the target second edge lines being included in the plurality of second edge lines, the second sequential order indicating a sequence of the target second edge lines arranged in an order in which each of the target second lines is selected by the second operation, a number of the second sequential order corresponding to a number of the first sequential order;

associating, for each of the target second edge lines arranged in the second sequential order, a target second edge line with a target first edge line, the target second edge line being one of the target second edge lines, the target first edge line being one of the target first edge lines arranged in the first sequential order, both the target first edge line and the target second edge line being in a same rank between the first sequential order and the second sequential order; and superimposing, on the screen, the three dimensional model with the structure in the captured image in accordance with a result of the associating.

* * * * *